US008471589B2

(12) United States Patent
Zhang et al.

(10) Patent No.: US 8,471,589 B2
(45) Date of Patent: Jun. 25, 2013

(54) METHOD AND APPARATUS FOR ALTERNATOR STATOR TURN-TO-TURN SHORT DETECTION

(75) Inventors: Yilu Zhang, Northville, MI (US); Siwei Cheng, Atlanta, GA (US); Mutasim A. Salman, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 230 days.

(21) Appl. No.: 13/161,939

(22) Filed: Jun. 16, 2011

(65) Prior Publication Data

US 2012/0319722 A1 Dec. 20, 2012

(51) Int. Cl.
*G01R 31/34* (2006.01)

(52) U.S. Cl.
USPC ........................ 324/765.01; 324/177; 324/139

(58) Field of Classification Search
None
See application file for complete search history.

(56) References Cited

U.S. PATENT DOCUMENTS

| | | | |
|---|---|---|---|
| 4,178,546 A | 12/1979 | Hulls | |
| 4,315,204 A | 2/1982 | Sievers | |
| 4,949,001 A | 8/1990 | Campbell | |
| 6,580,284 B1 | 6/2003 | Eckardt | |
| 6,611,771 B1 | 8/2003 | Habetler | |
| 6,806,727 B2 | 10/2004 | Thibedeau | |
| 7,205,756 B1 | 4/2007 | Baker | |
| 7,539,549 B1 | 5/2009 | Discenzo | |
| 7,592,772 B2 | 9/2009 | Nandi | |
| 7,772,870 B2 | 8/2010 | Inamura | |
| 8,339,078 B2 * | 12/2012 | Hui | ........................ 318/400.26 |
| 2008/0298784 A1 * | 12/2008 | Kastner | ........................ 388/811 |
| 2010/0141294 A1 | 6/2010 | Seeley | |
| 2012/0326704 A1 * | 12/2012 | Atay | ........................ 324/177 |

OTHER PUBLICATIONS

Joksimovie, Gojko M. "The Detection of Intern-Turn Short Circuits in the Stator Windings of Operating Motors", Oct. 2000 IEEE Transactions on Industrial Electronics, vol. 47, No. 5.
McDermid, W. "Experience With Directional Couplers for Partial Discharging Measurements on Rotating Machines in Operation" Jun. 1999 IEEE Transactions on Energy Conversion, vol. 14, No. 2.
Kliman, GB. "A New Approach to On-Line Turn Fault Detection in AC Motors" 1996 IEEE.
Lee, Youngkook, "A Stator Turn Fault Detection Method and a Fault-Tolerant Operating Strategy for Interior PM Synchronous Motor Drives In Safety-Critical Applications" Aug. 2007 , A Dissertation presented to the Academic Faculty, Copyrighted, 287 pgs.

* cited by examiner

*Primary Examiner* — Jermele M Hollington
*Assistant Examiner* — Trung Nguyen
(74) *Attorney, Agent, or Firm* — John A. Miller; Miller IP Group, PLC

(57) ABSTRACT

A method for detecting whether the stator in a vehicle alternator has a turn-to-turn short circuit. The method includes determining an output current or voltage signal of the alternator, where the output current or voltage signal includes a ripple current frequency as a result of an AC-to-DC conversion. The method determines the speed of the alternator and a current output of the alternator. The method then determines the ripple current frequency of the alternator from the alternator speed, and determines a winding frequency from the ripple current frequency. The method performs an FFT analysis on the voltage and current signal, determines an amplitude of the winding frequency and compares the amplitude of the winding frequency to a predetermined amplitude, where if the difference exceeds a predetermined threshold, a turn-to-turn short circuit is likely occurring.

20 Claims, 6 Drawing Sheets

METHOD AND APPARATUS FOR ALTERNATOR STATOR TURN-TO-TURN SHORT DETECTION

BACKGROUND OF THE INVENTION

1. Field of the Invention

This invention relates generally to a system and method for providing turn-to-turn short circuit detection in the stator of an alternator and, more particularly, to a system and method for providing turn-to-turn short circuit detection in the stator of a vehicle alternator by determining a speed of the alternator, determining an alternator ripple current frequency in a rectified alternator current or voltage signal, determining a winding ripple current frequency from the alternator ripple current frequency, determining an amplitude of the winding ripple current frequency and comparing the amplitude to an estimated amplitude.

2. Discussion of the Related Art

Vehicles typically include an alternator that provides electrical power to recharge a vehicle battery and operate the vehicle electrical systems when the vehicle is running. The alternator includes a pulley that engages a flexible belt driven by the vehicle engine, where the belt also drives other vehicle components, such as a power steering pump, an air compressor, etc. As the belt rotates the alternator pulley, the pulley rotates a rotor within a stator of the alternator, where the rotor typically has a permanent magnet and the stator includes one or more wound coils. A typical vehicle alternator will include three stator windings that are 90° out-of-phase with each other that generate three AC signals that are sent to a three-phase diode bridge rectifier to convert the AC signals to a DC signal suitable for recharging the battery. The alternator will also include a voltage regulator that regulates the DC signal. The diode bridge rectifier generates an AC ripple signal on the DC signal as a factor of the conversion. Various filtering techniques and other operations can be performed to reduce the ripple current generated by the rectifier conversion, but there still will be some level of AC ripple on the DC signal that can be detected.

As mentioned above, the stator of a vehicle alternator includes a number of windings, which are typically narrow wires enclosed by insulation that prevents the wires from being in electrical contact with each other and short circuiting. Through operation of the vehicle and otherwise, sometimes the insulation of the wires can be damaged, which may cause a short circuit between the wires, referred to in the industry as a turn-to-turn short fault. Also, it is possible that the windings can be short circuited to ground, which also has the same undesirable effect as the turn-to-turn short fault. If such a turn-to-turn short fault occurs in one of the windings, then that particular phase of the alternator will have a reduced output current, depending on the number of windings that are involved in the short circuit, which reduces the torque of the alternator. Further, if one of the phases has a lower output current, then the alternator may become unbalanced, which may cause vibrations. Further, if the turn-to-turn short fault is significant enough, the alternator may overheat, which could damage alternator components, such as the alternator core.

Currently, there does not exist a technique for detecting a turn-to-turn short fault in a vehicle alternator. However, in other industries, it is known to detect a turn-to-turn short circuit of related electrical machines, most notably high voltage AC machine. For example, it is known to detect a high frequency current within an electrical machine caused by a partial discharge due to winding insulation damage. In another technique, the voltage and current of each winding phase is measured in the electrical machine and are compared to each other to detect a negative current sequence indicating a turn-to-turn short circuit. Yet another technique uses frequency spectrum analysis to detect a turn-to-turn short circuit in an electrical machine, but also requires phase voltage and current measurements from each of the windings. Another technique to detect a turn-to-turn short in an electrical machine monitors the motor control signals to detect a fault signature that will occur by the control signals trying to compensate for the short circuit.

All of the above described techniques require measurement of the phase voltage and current of the windings in the electrical machine. Because these measurements require sensors, it is an added cost to an automotive application that is undesirable.

SUMMARY OF THE INVENTION

In accordance with the teachings of the present invention, a system and method are disclosed for detecting whether the stator in a vehicle alternator has a turn-to-turn short circuit. The method includes determining an output current or voltage signal of the alternator, where the output current or voltage signal includes a ripple current frequency as a result of an AC-to-DC conversion. The method determines the speed of the alternator and a current output of the alternator. The method then determines the ripple current frequency of the alternator from the alternator speed, and determines a winding frequency from the ripple current frequency. The method performs an FFT analysis on the voltage and current signal, determines an amplitude of the winding frequency and compares the amplitude of the winding frequency to a predetermined amplitude, where if the difference exceeds a predetermined threshold, a turn-to-turn short circuit is likely occurring.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for detecting a turn-to-turn short circuit in a stator of a vehicle alternator is merely exemplary in nature, and is in no way intended to limit the invention or its applications or uses. For example, the present invention has particular application for determining a turn-to-turn short circuit of a vehicle alternator. However, as well be appreciated by those skilled in the art, the system and method described herein for determining turn-to-turn short circuit in an alternator will have application for other alternators other than vehicle alternators.

Figure 1:
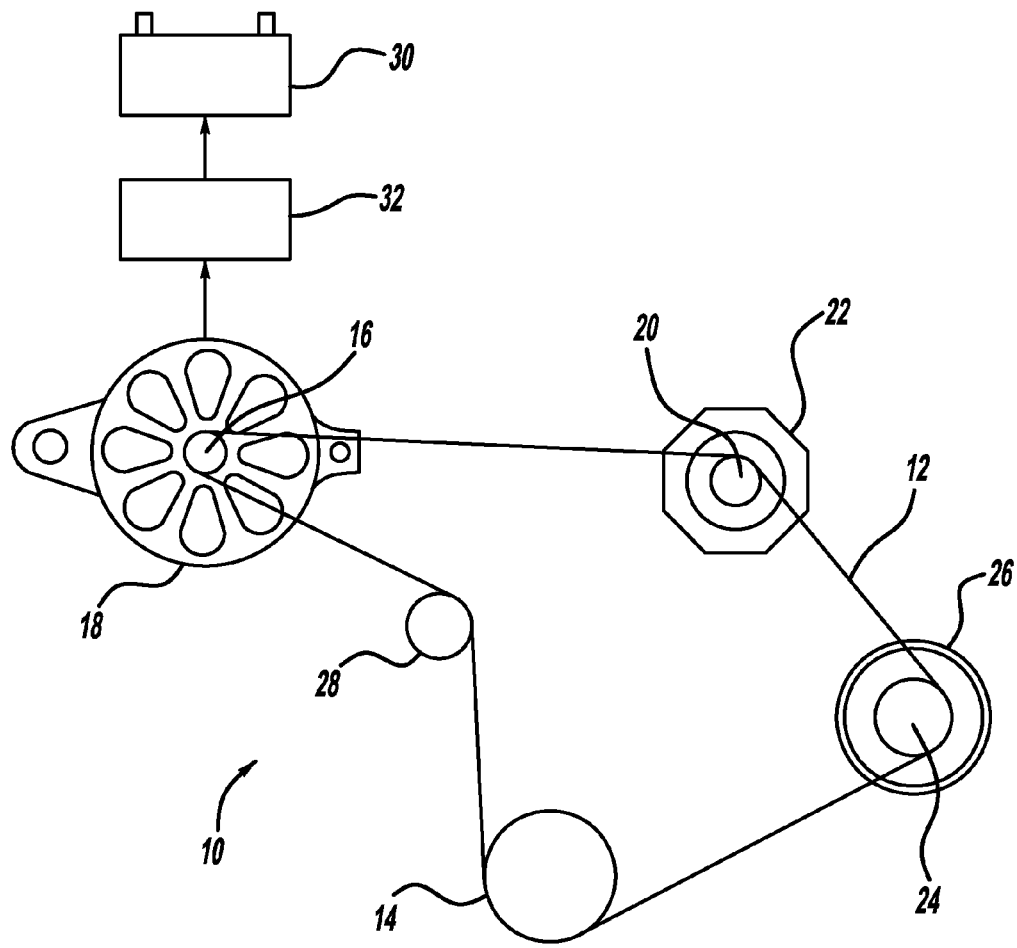
FIG. 1 is a representation of a vehicle alternator and belt system.

FIG. 1 is a schematic type diagram of a vehicle front end accessory drive system 10 including a drive belt 12. The system 10 includes an engine crank shaft 14 that is rotated by the vehicle engine and provides rotational energy for driving the drive belt 12 in a manner that is well understood by those skilled in the art. The drive belt 12 engages a pulley 16 of an alternator 18, and provides the rotational energy for turning the rotor (not shown) within the alternator 18 to generate electrical energy in the manner discussed above and well known to those skilled in the art. The drive belt 12 also engages a pulley 20 of a power steering pump 22 and a pulley 24 of an air compressor 26 to provide rotational energy to operate those devices. A belt tensioner 28 provides the proper tension on the drive belt 12 so that the belt 12 does not easily slip on the crank shaft 14 or the pulleys 16, 20 and 24. The electrical energy generated by the alternator 18 provides power to drive various vehicle electrical systems and charge a vehicle battery 30.

The AC signal generated by the alternator 18 is provided to a rectifier circuit 32 that typically employs a three-phase diode bridge to convert the AC signal to a DC signal suitable to charge the battery 30. A three-phase machine of this type generally requires six diodes that are part of a circuit that provides the rectification in a manner that is well understood by those skilled in the art. As discussed above, this AC-to-DC conversion generates a ripple current frequency signal on the DC signal that can be detected.

The present invention proposes a technique for detecting a turn-to-turn short circuit of the windings in the alternator 18 using frequency spectrum analysis. The frequency power spectrum of the alternator current or voltage is provided and a ripple current within the spectrum is identified. The magnitude of a winding frequency portion of the ripple frequency is then compared to a magnitude of a ripple frequency without a turn-to-turn short circuit to determine whether the short circuit exists.

Figure 2:
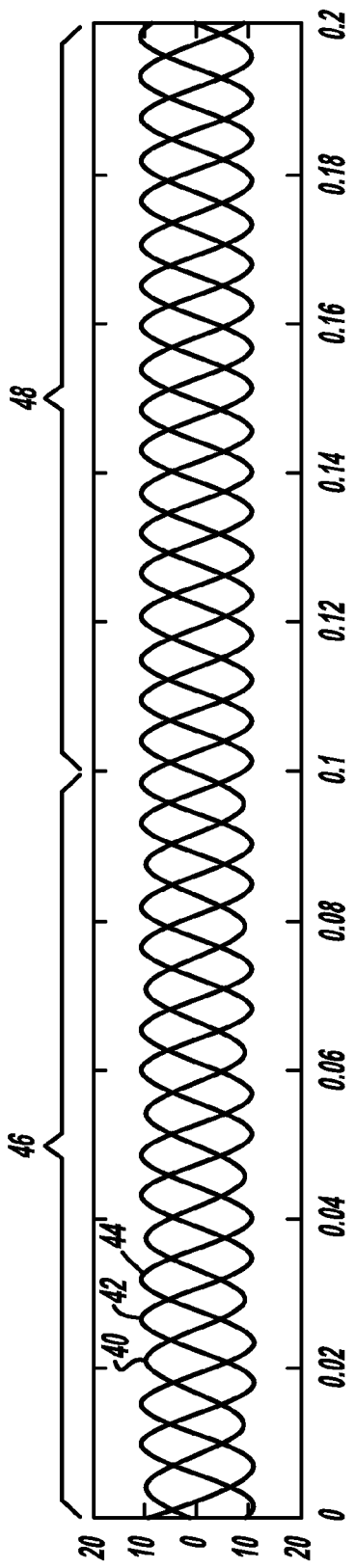
FIG. 2 is a graph with time on the horizontal axis and voltage on the vertical axis showing the voltage output of each winding in a three-phase alternator.

FIG. 2 is a graph with time on the horizontal axis and voltage on the vertical axis showing a simulated AC voltage output of each winding for a three-phase alternator, such as the alternator 18, where graph line 40 is for one winding phase, graph line 42 is for another winding phase and graph line 44 is for the third winding phase. A turn-to-turn short circuit is simulated in the phase winding for the graph line 40 at section 46 between time 0 and 0.1 and no turn-to-turn short circuit is simulated in section 48 in any of the phase windings between time 0.1 and 0.2. As is apparent, the magnitude of the voltage of the phase winding for the graph line 40 is less during the short circuit.

Figure 3:
FIG. 3 is a graph with time on the horizontal axis and rectified output voltage on the vertical axis showing the rectified voltage for each output voltage for each stator winding shown in FIG. 2.

FIG. 3 is a graph with time on horizontal axis and the rectified output voltage of the alternator 18 for all of the winding phases on the vertical axis. The rectified voltage output is intended to be a DC voltage of a certain magnitude, but where the ripple current induced by the rectifying process causes peaks at certain intervals imposed on the DC voltage. In the simulation where there is no turn-to-turn short circuit between time 0.1 and 0.2, all of the ripple current peaks 50 have the same magnitude. However, for the simulation where the one phase winding represented by the graph line 40 has a turn-to-turn short circuit, every third ripple current peak will have a higher magnitude, shown by peaks 52 in the simulated turn-to-turn short circuit between time zero and 0.1.

As is apparent, the simulation voltages of FIGS. 2 and 3 provide a clean and readily apparent ripple current, where the turn-to-turn short circuit can be easily observed. However, for actual measurements of an actual operating alternator, the rectified alternator voltage for an alternator having a turn-to-turn short circuit and one that doesn't is less apparent. This can be observed in FIGS. 4 and 5, which are graphs with time on the horizontal axis and alternator current magnitude on the vertical axis, where FIG. 4 shows the rectified current of the alternator without a turn-to-turn short circuit and FIG. 5 shows the rectified current of the alternator with a turn-to-turn short circuit.

As mentioned above, frequency spectrum analysis can be employed to identify the ripple current that can be used to then indicate whether a turn-to-turn short circuit exist. It is known that a current or voltage signal can be analyzed by a Fast Fourier Transform (FFT) operation that decomposes the signal into its constituent frequencies to identify a frequency spectrum of the signal.

Figure 4:
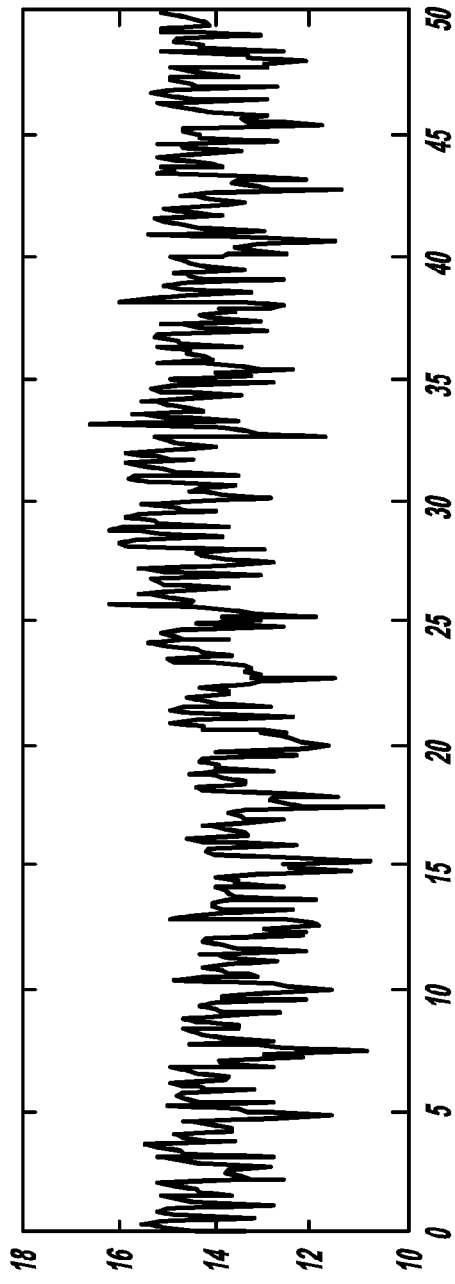
FIG. 4 is graph with time on the horizontal axis and current magnitude on the vertical axis showing a current output signal of an alternator with no turn-to-turn short circuit.
Figure 6:
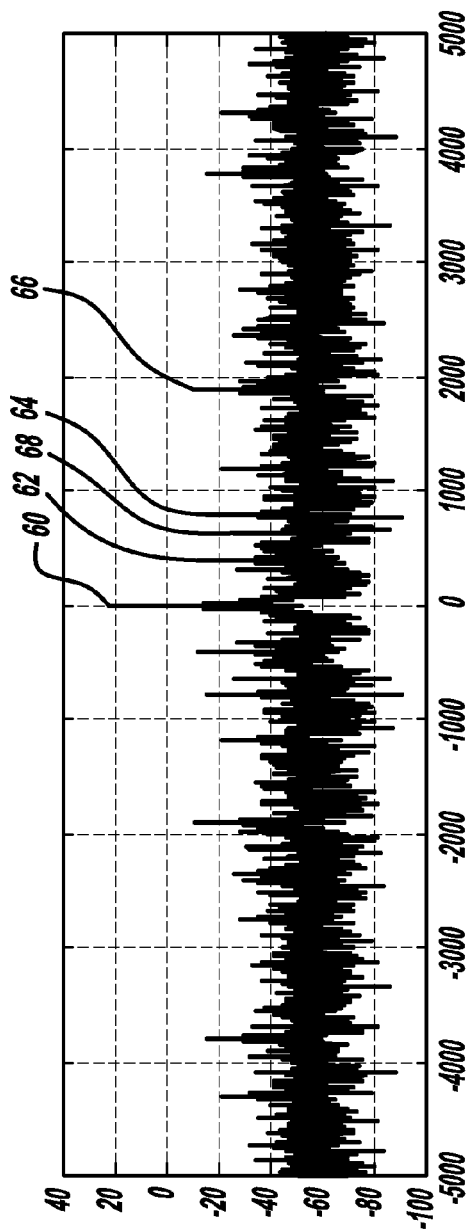
FIG. 6 is a graph with frequency on the horizontal axis and magnitude in dB on the vertical axis showing the frequency spectrum for an output current of a vehicle alternator that does not include a turn-to-turn short circuit.

FIG. 6 is a graph with frequency on the horizontal axis and magnitude in dB on the vertical axis showing the frequency spectrum for the graph of FIG. 4 with no turn-to-turn short circuit. A peak 60 at zero frequency represents the DC signal, a harmonic peak 62 is a field duty cycle of the armature or rotor in the alternator 18 at about 400 Hz and a second harmonic peak 64 of the field duty cycle is shown at about 800 Hz, which are all known. A peak 66 at about 1898 Hz is the frequency of the ripple current. Peak 68 is the ripple current frequency peak for each of the phase windings in the alternator 18, which would be about one third of the ripple current frequency peak of 1898 Hz, or about 632.3 Hz. For an alternator with no turn-to-turn short circuit in any of the phase windings, the ripple current frequency peak for each phase winding will have a magnitude of about −25.61 dB in this non-limiting example.

Figure 5:
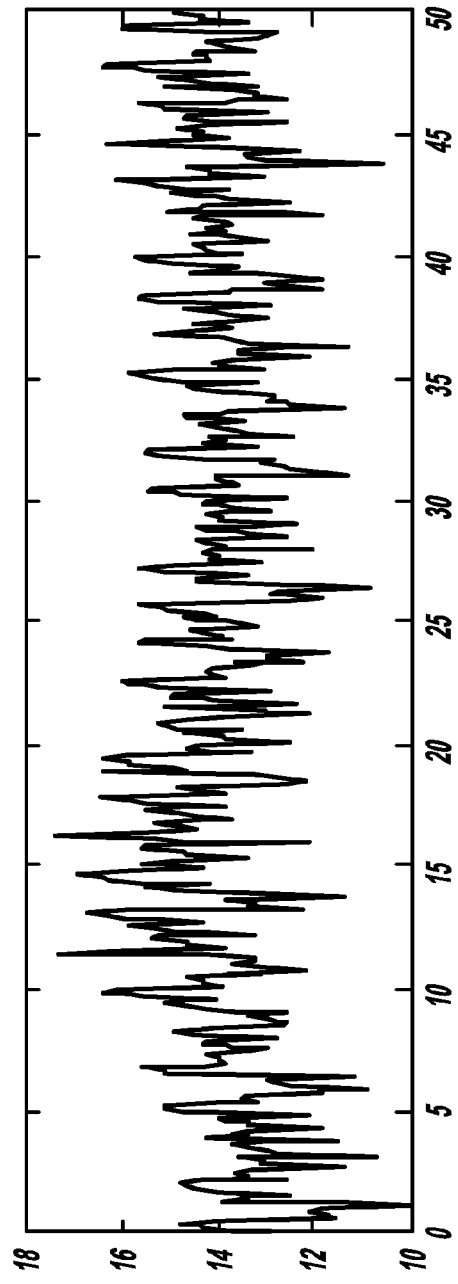
FIG. 5 is a graph with time on the horizontal axis and current magnitude on the vertical axis showing a current output signal of an alternator that does have a turn-to-turn short circuit.
Figure 7:
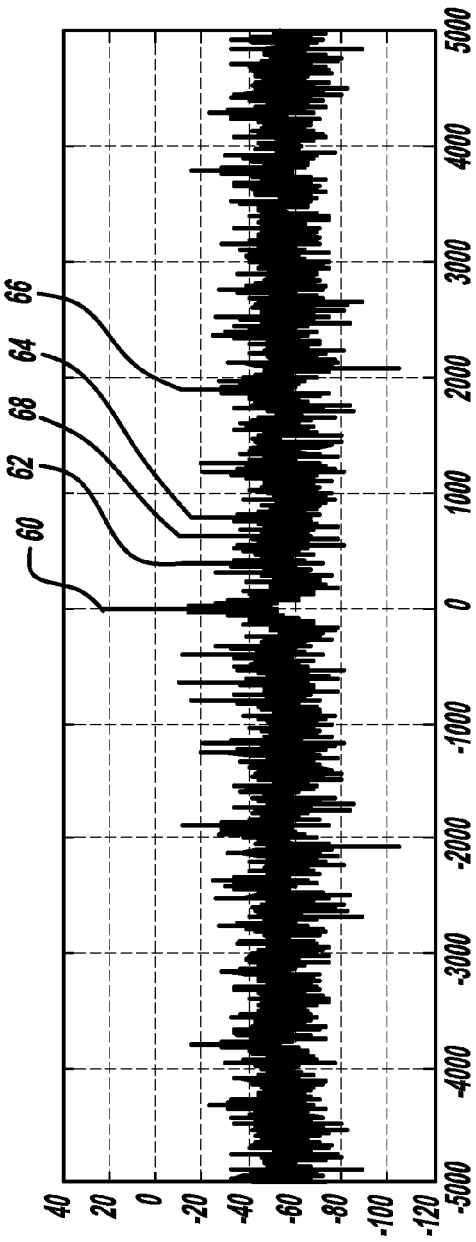
FIG. 7 is a graph with frequency on the horizontal axis and magnitude in dB on the vertical axis showing the frequency spectrum of FIG. 6 for a vehicle alternator that does have a turn-to-turn short circuit.

FIG. 7 is a graph with frequency on the horizontal axis and magnitude in dB on the vertical axis showing the frequency spectrum for the graph of FIG. 5 with a turn-to-turn short circuit in one of the windings. As is apparent, the peak 68 has increased in amplitude to about −10.11 dB, which is greater than three times the magnitude of the peak 68 when there is no turn-to-turn short circuit. Thus, a comparison between the expected magnitude of the peak 68 when no turn-to-turn short circuit is present with the peak 68 in the actual frequency spectrum of the measured alternator voltage or current can be used to determine whether a turn-to-turn short circuit is occurring by the peak 68 being greater than what it should be by some certain percentage. The magnitude of the peak 68 should increase as the number of turns in the winding that are shorted increases.

Figure 8:
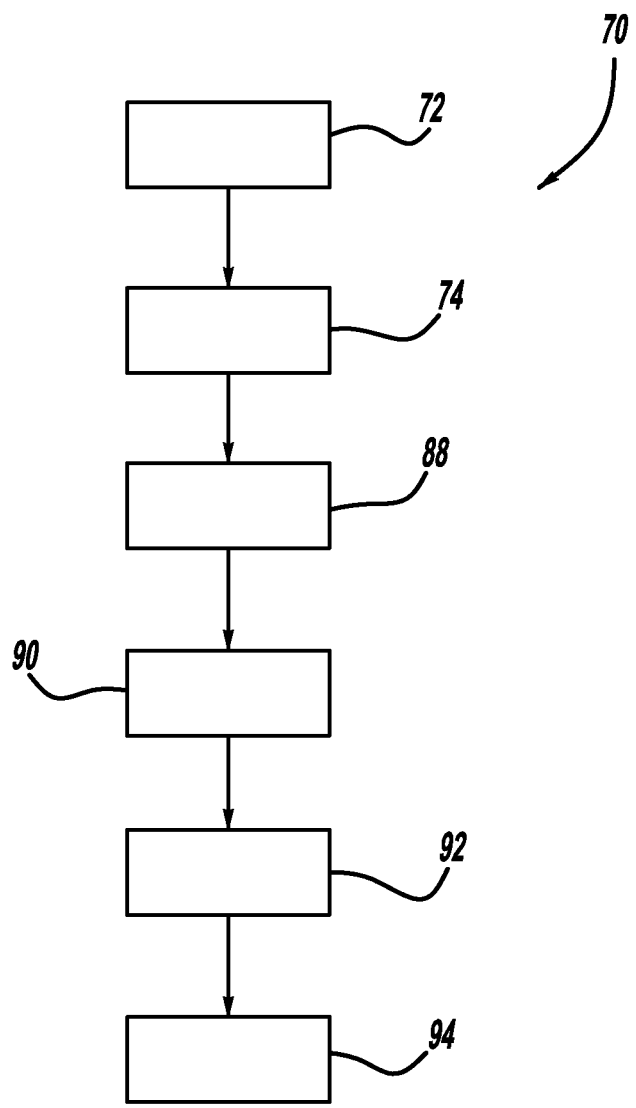
FIG. 8 is a flow chart diagram showing a process for detecting a turn-to-turn short circuit in a vehicle alternator.

FIG. 8 is a flow chart diagram 70 showing a process for detecting a turn-to-turn short circuit in the alternator 18 by determining the frequency of the ripple current on the DC signal that charges the battery 30 using spectrum analysis. The ripple current can be obtained by first knowing the voltage or current of the DC signal output from the rectifier circuit 32, but vehicles typically do not employ sensors on the alternator 18 to provide those measurements. However, there are existing sensors on modern vehicles that measure battery current and voltage, and this voltage and current has the same signature as the rectified alternator voltage and current. Therefore, the present invention determines the current or voltage of the battery 30 using available sensors at box 72. In one embodiment, the battery current or voltage measurements over a certain time period are used for each calculation, such as 50 ms.

Next, the algorithm determines the speed $RPM_{alt}$ of the alternator 18 at box 74. Traditionally, the speed $RPM_{alt}$ of the alternator 18 is equal to the speed $RPM_{egn}$ of the vehicle engine times the pulley ratio $R_{pulley}$ of the pulley 16, as defined in equation (1) below.

$$RPM_{alt} = RPM_{egn} * R_{pulley} \tag{1}$$

Alternately, the speed $RPM_{alt}$ of the alternator 18 can be estimated using any suitable technique, which may be desirable if the belt 12 may potentially be slipping. U.S. patent application Ser. No. 13/083,841, titled Alternator Speed Estimation Using Spectrum Analysis, filed Apr. 11, 2011, assigned to the assignee of this application and herein incorporated by reference, discloses a technique for estimating the speed $RPM_{alt}$ of an alternator using spectrum analysis. A significant discussion from that application is recreated below, which is based on spectrum analysis, such as the power spectrum shown in FIG. 6.

The technique disclosed in the '841 application identifies the ripple current peak 66 in the frequency spectrum analysis, which needs to be isolated from the other peaks in the spectrum. Because the frequency of the peaks 60, 62 and 64 are known, the measured battery current or voltage signal can be filtered by a notch filter, which filters all of the frequencies between predetermined upper and lower limits, to remove those frequency peaks to isolate the ripple current peak 66 that is being determined. The notch filtering is performed on the measured battery current or voltage signal for each known frequency that is to be removed. Equation (2) below gives an example of a suitable digital notch filter for this purpose.

$$H(z) = \frac{(1 - e^{j\omega_0}z^{-1})(1 - e^{-j\omega_0}z^{-1})}{(1 - re^{j\omega_0}z^{-1})(1 - re^{-j\omega_0}z^{-1})} \tag{2}$$

$$= \frac{1 - 2\cos\omega_0 z^{-2} + z^{-2}}{1 - 2r\cos\omega_0 z^{-1} + r^2 z^{-2}}$$

Where H is the z-transform of the filter, $\omega_0$ is the frequency that is being rejected and r sets the frequency width of the notch, where the closer r is to 1, the sharper the notch.

The algorithm may determine whether this is the first calculation for determining the alternator speed $RPM_{alt}$ after vehicle ignition or after some action that causes the vehicle to lose track of the alternator speed for reasons that will become apparent from the discussion below.

The processing required to perform the FFT operation to obtain the power spectrum shown in FIG. 6 is significant and complex, and generally beyond the reasonable computing capacity of an electronic control unit (ECU) on a vehicle.

Therefore, instead of providing a complete FFT spectrum analysis on the filtered battery current or voltage signal, a limited FFT operation can be performed using a limited number of data points or bins to reduce the sample size and the complexity of the operation. In this non-limiting embodiment, the FFT operation includes windowing to reduce spectrum leakage, such as Hanning windowing, well understood by those skilled in the art, using 256 data points. By reducing the number of spectrum analyzed data points to 256, the frequency resolution of the spectrum signal is about 39 Hz between data bins.

The algorithm then defines a search range within the filtered and data point limited frequency spectrum signal that the algorithm will specifically look at to identify the highest peak, which should now be the ripple current frequency after the filtering. A pre-frequency ripple current is identified, which can be the estimated ripple current frequency from the previous sample period or a frequency that the ripple current is expected to be. The algorithm adds and subtracts a certain frequency, such as 250 Hz, to and from the pre-frequency to identify a search range of about 500 Hz. Once the search range is identified for determining the ripple current peak 66, a peak detection process is performed to identify the highest peak within that range.

Figure 9:
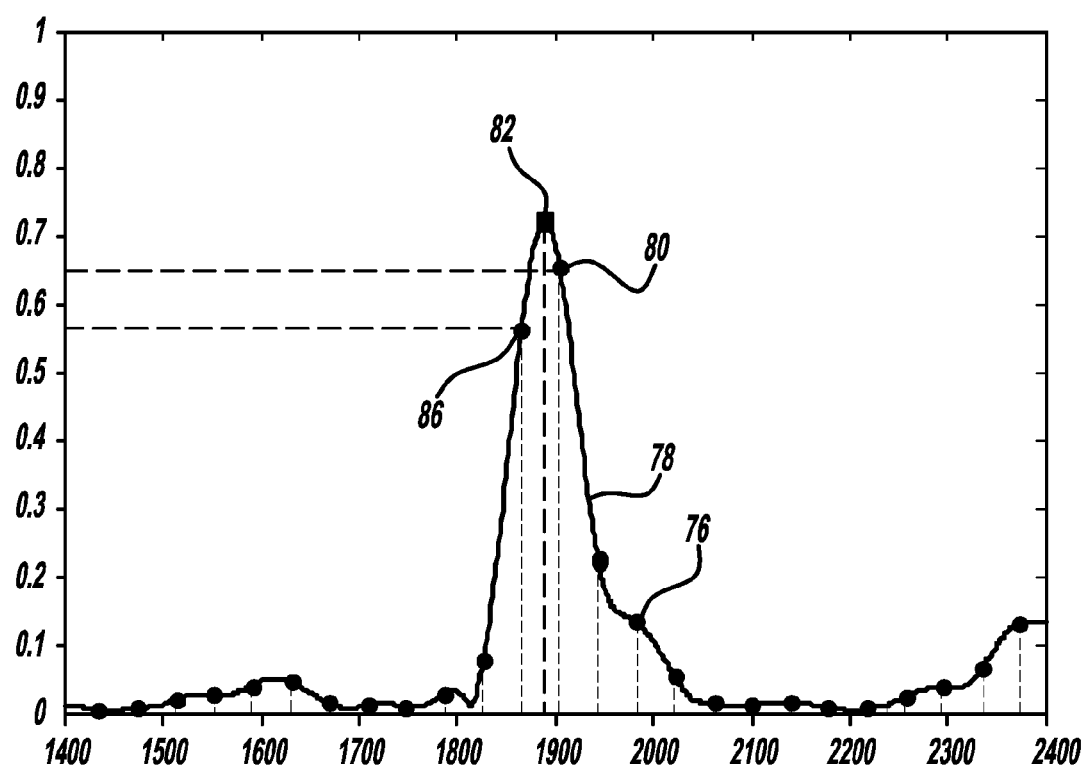
FIG. 9 is a graph with frequency on the horizontal axis and magnitude on the vertical axis showing a portion of a filtered FFT signal within a predetermined peak search range.

FIG. 9 is a graph with frequency on the horizontal axis and magnitude on the vertical axis showing data points 76 from the low FFT resolution analysis for the frequencies in the search range of about 1750-2250 Hz. Graph line 78 represents the smooth frequency spectrum of the FFT analysis that would have resulted from a full spectrum analysis.

Because the frequency resolution of the FFT spectrum signal between the data points is 39 Hz, it is desirable to refine the peak localization to specifically identify the actual ripple current frequency because a resolution of 39 Hz represents a difference in the rotational speed of the alternator 18 of about 65 RPMs. In other words, the peak identified by the peak detection process from the available data points in the limited spectrum analysis is unlikely to be the actual ripple current frequency because of the distance between the data points in the frequency spectrum, and could possibly be as much as 39 Hz away from the actual ripple current frequency.

In the graph shown in FIG. 9, the identified highest peak of the data points 76 would be data point 80, but the actual ripple current frequency is at point 82. An interpolation process is used to refine the peak localization between the data point 80 and a next highest adjacent data point 86 to identify the actual ripple current at the peak identified by the point 82. The frequency interval between the spectral bins in the current spectrum is:

$$f_0 = \frac{1}{N\Delta t} \tag{3}$$

Where $\Delta t$ is the time interval between data samples and N is the number of data points in the FFT.

The peak frequency f at the point 82 can be determined as:

$$f = (i + \delta)f_0 = \lambda f \tag{4}$$

Where $\delta$ is:

$$\delta = \frac{2\alpha - 1}{\alpha + 1} \tag{5}$$

Where α is:

$$\alpha = \frac{|x(i+1)|}{|x(i)|} \quad (6)$$

Where X is the magnitude of the FFT data points, i is the location of the data point 86 and i+1 is the location of the data point 80.

Once the ripple frequency f is identified by the interpolation process, the algorithm calculates the alternator speed in RPMs for a three winding stator as the ripple frequency f divided by the number of pole pairs in the alternator 18 divided by the number of diodes in the rectifier circuit 32 and times 60 seconds, i.e., f/# pole pairs/# of diodes*60. The algorithm then again calculate the alternate speed for the next sample time of the battery voltage or current measurements.

If the algorithm determines that it is not right after vehicle ignition and previous alternator speed calculations have been made and are available, the algorithm can perform an even more reduced complexity FFT analysis, which will still give an accurate ripple current identification based on the previous alternator speed calculations. Particularly, the algorithm limits the frequency peak search range to a few of the frequency data bins, such as five, around the last detected ripple current frequency peak. In other words, instead of the peak detection using the several data points 76 shown in FIG. 9 for the first calculation of the alternator speed, the algorithm will search for the peak frequency point using only five of the data points around the point 82. The algorithm performs a single-frequency FFT spectral operation, sometimes known as a Goertzel algorithm, for each of the five data bins in the reduced frequency range, to identify the new frequencies for the data bins around the last determined ripple current frequency.

The magnitude X of each of the data points within the data bins for the reduced frequency range is then determined as:

$$s(n) = I(n) + 2\cos(2\pi\omega)s(n-1) - s(n-2) \quad (7)$$

$$X(n) = s(n) - e^{-2\pi j\omega}s(n-1) \quad (8)$$

Where s(n) is an intermediate variable, I(n) is the current measurement, ω is the frequency of the particular selected data bin for the new calculation, X(n) is the amplitude of the frequency at the bin, n=t, t−1, ..., t−255, and j is sqrt(−1).

Once each new frequency magnitude X(n) has been obtained for each of the five data bins, the algorithm performs the peak detection for those magnitudes to identify the highest peak. The interpolation process is then again performed to identify the actual ripple current frequency and the rotational speed of the alternator 18 is calculated.

At box 88, the algorithm estimates or measures the output current $I_{alt}$ of the alternator 18. As mentioned above, it is unlikely that there is a current sensor for measuring the alternator current, although there could be. If the battery current is measured at the box 72, then that value can be used as the alternator current. A typical vehicle alternator will include a current sensor for measuring the field current of the alternator, which is proportional to the field duty cycle. For those cases where the alternator current $I_{alt}$ needs to be estimated, the alternator current $I_{alt}$ can be determined from the function:

$$I_{alt} = f(RPM_{alt}, F_{dc}) \quad (9)$$

Where $F_{dc}$ is the field duty cycle of the alternator 18, and is typically proportional to the alternator field current at a given alternator speed. In practice, the function f can be represented by a look-up table, where the entries of the table are calibrated during development of the system.

At box 90, the algorithm calculates the frequency of interest ω, which is ⅓ of the ripple current frequency f because it is a three winding alternator. In other words, the frequency of interest ω is the frequency in the frequency spectrum of the rectified alternator voltage or current that identifies the ripple current for one of the windings in the alternator 18. If the algorithm used the approach in the '841 application for estimating the alternator speed $RPM_{alt}$, the ripple current frequency f would have already been determined and the frequency of interest ω would be ⅓ of the determined ripple current frequency f. If the speed of the alternator 18 was determined from equation (1) or if the speed of the alternator is used from the process in the '841 application, then the frequency of interest ω can be determined as:

$$\omega = \tfrac{1}{3}*(RPM_{alt}*\# \text{ of pole pairs}*\# \text{ of diodes}/60) \quad (10)$$

At box 92, the algorithm performs an FFT analysis on the battery current or voltage measurements obtained at the box 72 and identifies the amplitude X(ω) of the frequency band of interest ω. If the FFT spectrum analysis was obtained from the alternator speed estimation as in the '841 application discussed above, and as shown in FIG. 6, then that analysis can be used to obtain the amplitude X(ω) of the frequency of interest ω. Otherwise, the FFT spectrum analysis discussed above is performed by the algorithm at this point in the process to obtain the spectrum analysis shown in FIG. 6 that is then used to determine the amplitude X(ω) at the frequency of interest ω. In order to reduce computational complexity, instead of performing a full FFT spectrum analysis as shown in FIG. 6, the algorithm can perform a single-frequency FFT spectrum analysis, such as the Goertzel algorithm, as discussed above for equations (7) and (8). In this calculation, the amplitude X(ω) replaces X(n) as the amplitude of the frequency of interest ω.

At box 94, the algorithm compares the amplitude X(ω) to an expected amplitude for no short circuit in a look-up table over the alternator speed $RPM_{alt}$ and the alternator current $I_{alt}$ to determine whether it is larger than the expected amplitude, and if yes, determines that a turn-to-turn short circuit is occurring.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for determining whether a turn-to-turn short circuit is occurring in a stator winding of an alternator, said method comprising:
    determining an output voltage or current of the alternator, where the output voltage or current includes an alternator ripple current frequency as a result of an AC-to-DC conversion of the output of the alternator;
    determining a speed of the alternator;
    determining the alternator ripple current frequency of the alternator from the speed of the alternator;
    determining a winding ripple current frequency from the alternator ripple current frequency;
    determining an amplitude of the winding ripple current frequency;
    comparing the amplitude of the winding ripple current frequency to a predetermined amplitude; and
    determining that a turn-to-turn short circuit is occurring if the difference between the amplitude of the winding ripple current frequency and the predetermined amplitude is greater than a predetermined threshold.

2. The method according to claim 1 wherein determining an output voltage or current of the alternator includes measuring a current or voltage of a battery where the alternator recharges the battery.

3. The method according to claim 1 wherein determining a speed of the alternator includes determining the speed of the alternator based on a speed of a vehicle engine and a pulley ratio of the alternator.

4. The method according to claim 1 wherein determining a speed of the alternator includes performing a fast Fourier transform (FFT) operation to identify a frequency spectrum signal of the output voltage or current of the alternator, identifying a peak detection search range within the frequency spectrum signal within which the alternator ripple current frequency is known to exist, identifying a highest peak frequency within the search range as the alternator ripple current frequency, and converting the highest peak frequency to the alternator speed.

5. The method according to claim 1 wherein determining the winding ripple current frequency includes using the equation:

$$\omega = \tfrac{1}{3} * (RPM_{alt} * \# \text{ of pole pairs} * \# \text{ of diodes}/60)$$

where $\omega$ is the winding ripple current frequency, $RPM_{alt}$ is the speed of the alternator, # of pole pairs is the number of pole pairs in the alternator and # of diodes is the number of diodes in a rectifier circuit.

6. The method according to claim 1 wherein determining an amplitude of the winding ripple current frequency includes performing a fast Fourier transform (FFT) on the output voltage or current of the alternator to get a frequency spectrum signal.

7. The method according to claim 6 wherein performing the FFT process includes performing a single-frequency FFT process.

8. The method according to claim 7 wherein determining an amplitude of the winding ripple current frequency includes using the equations:

$$s(n) = I(n) + 2\cos(2\pi\omega)s(n-1) - s(n-2)$$

$$X(n) = s(n) - e^{-2\pi j\omega}s(n-1)$$

where s(n) is an intermediate variable, I(n) is the current (or voltage) measurement, $\omega$ is the frequency of the particular selected data bin, X(n) is the amplitude of the winding ripple current frequency at the bin, n=t, t−1, ..., t−255, and j is sqrt(−1).

9. The method according to claim 1 further comprising determining an alternator current output of the alternator that is a function of the speed of the alternator and a field duty cycle of the alternator.

10. The method according to claim 9 wherein comparing the amplitude of the winding ripple current frequency to a predetermined amplitude includes comparing the amplitude of the winding ripple current frequency to the predetermined amplitude over the speed and current of the alternator.

11. A method for determining whether a turn-to-turn short circuit is occurring in a stator winding of an alternator, said method comprising:

measuring a battery current or voltage of a vehicle that is being charged by the alternator, where the battery current or voltage measurement includes an alternator ripple current frequency as a result of an AC-to-DC conversion of the output voltage or current;

determining a speed of the alternator;

estimating an output current of the alternator based on the speed of the alternator and a field duty cycle of the alternator;

determining the alternator ripple current frequency of the alternator from the speed of the alternator;

determining a winding ripple current frequency from the alternator ripple current frequency;

performing a single-frequency fast Fourier transform (FFT) analysis of the output voltage or current of the alternator to generate a frequency spectrum;

determining an amplitude of the winding ripple current frequency from the frequency spectrum;

comparing the amplitude of the winding ripple current frequency to a predetermined amplitude; and determining that a turn-to-turn short circuit is occurring if the difference between the amplitude of the winding ripple current frequency and the predetermined amplitude is greater than a predetermined threshold over the speed and current of the alternator.

12. The method according to claim 11 wherein determining a speed of the alternator includes determining the speed of the alternator based on a speed of a vehicle engine and a pulley ratio of the alternator.

13. The method according to claim 11 wherein determining a speed of the alternator includes identifying a peak detection search range within the frequency spectrum within which the alternator ripple current frequency is known to exist, identifying a highest peak frequency within the search range as the alternator ripple current frequency, and converting the highest peak frequency to the alternator speed.

14. The method according to claim 11 wherein determining the winding ripple current frequency includes using the equation:

$$\omega = \tfrac{1}{3} * (RPM_{alt} * \# \text{ of pole pairs} * \# \text{ of diodes}/60)$$

where $\omega$ is the winding ripple current frequency, $RPM_{alt}$ is the speed of the alternator, # of pole pairs is the number of pole pairs in the alternator and # of diodes is the number of diodes in a rectifier circuit.

15. The method according to claim 11 wherein determining an amplitude of the winding ripple current frequency includes using the equations:

$$s(n) = I(n) + 2\cos(2\pi\omega)s(n-1) - s(n-2)$$

$$X(n) = s(n) - e^{-2\pi j\omega}s(n-1)$$

where s(n) is an intermediate variable, I(n) is the current (or voltage) measurement, $\omega$ is the frequency of the particular selected data bin, X(n) is the amplitude of the winding ripple current frequency at the bin, n=t, t−1, ..., t−255, and j is sqrt(−1).

16. A system for determining whether a turn-to-turn short circuit is occurring in a stator winding of an alternator, said system comprising:

means for determining an output voltage or current of the alternator, where the output voltage or current includes an alternator ripple current frequency as a result of an AC-to-DC conversion of the output of the alternator;

means for determining a speed of the alternator;

means for determining the alternator ripple current frequency of the alternator from the speed of the alternator;

means for determining a winding ripple current frequency from the alternator ripple current frequency;

means for determining an amplitude of the winding ripple current frequency;

means for comparing the amplitude of the winding ripple current frequency to a predetermined amplitude; and means for determining that a turn-to-turn short circuit is occurring if the difference between the amplitude of the winding ripple current frequency and the predetermined amplitude is greater than a predetermined threshold.

17. The system according to claim 16 wherein the means for determining a speed of the alternator determines the speed of the alternator based on a speed of a vehicle engine and a pulley ratio of the alternator.

18. The system according to claim 16 wherein the means for determining a speed of the alternator performs a fast Fourier transform (FFT) operation to identify a frequency spectrum signal of the output voltage or current of the alternator, identifying a peak detection search range within the frequency spectrum signal within which the alternator ripple current frequency is known to exist, identifying a highest peak frequency within the search range as the alternator ripple current frequency, and converting the highest peak frequency to the alternator speed.

19. The system according to claim 16 wherein the means for determining the winding ripple current frequency uses the equation:

$$\omega = \frac{1}{3} * (RPM_{alt} * \text{\# of pole pairs} * \text{\# of diodes}/60)$$

where $\omega$ is the winding ripple current frequency, $RPM_{alt}$ is the speed of the alternator, # of pole pairs is the number of pole pairs in the alternator and # of diodes is the number of diodes in a rectifier circuit.

20. The system according to claim 16 wherein the means for determining an amplitude of the winding ripple current frequency performs a single frequency fast Fourier transform (FFT) on the output voltage or current of the alternator to get a frequency spectrum signal.

* * * * *